(12) United States Patent
Kim et al.

(10) Patent No.: US 7,453,713 B2
(45) Date of Patent: Nov. 18, 2008

(54) DUAL CHIP PACKAGE

(75) Inventors: Hyung-Min Kim, Suwon-si (KR); Sang-Chul Kang, Hwaseong-si (KR); Jin-Yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 62 days.

(21) Appl. No.: 11/700,839

(22) Filed: Feb. 1, 2007

(65) Prior Publication Data
US 2007/0247930 A1 Oct. 25, 2007

(30) Foreign Application Priority Data
Apr. 19, 2006 (KR) .................. 10-2006-0035480

(51) Int. Cl.
*G11C 5/06* (2006.01)
(52) U.S. Cl. ............... 365/63; 365/185.05; 365/185.07; 365/230.06
(58) Field of Classification Search .................. 365/63, 365/185.05, 185.07, 230.06
See application file for complete search history.

(56) References Cited

U.S. PATENT DOCUMENTS

| | | | |
|---|---|---|---|
| 5,303,180 A * | 4/1994 | McAdams | 365/63 |
| 5,768,173 A * | 6/1998 | Seo et al. | 365/52 |
| 6,889,268 B2 | 5/2005 | Chae et al. | |
| 6,991,964 B2 * | 1/2006 | Matsuo et al. | 438/109 |
| 2005/0141318 A1 | 6/2005 | Lee | |

FOREIGN PATENT DOCUMENTS

| | | |
|---|---|---|
| JP | 2002-133884 | 5/2002 |
| JP | 2004-039211 | 2/2004 |
| JP | 2005-196739 | 7/2005 |
| KR | 1020040003558 A | 1/2004 |
| KR | 1020050067784 A | 7/2005 |

* cited by examiner

*Primary Examiner*—Tuan T. Nguyen
(74) *Attorney, Agent, or Firm*—Volentine & Whitt, PLLC

(57) ABSTRACT

The present invention is directed to a dual chip package that is connected to a host and includes a first memory chip and a second memory chip. Each of the first and second memory chips includes a flash memory; an option pad connected to either a first or second voltage; a register configured to store a flag signal indicating whether a memory chip is selected; a comparator circuit configured to compare a flag signal stored in the register with a logic value apparent at the option pad to generate a flash access signal. Each of the first and second memory chips also includes a memory controller unit configured to access the flash memory in response to the flash access signal, and an interrupt controller unit configured to provide an interrupt signal to the host in response to the flash access signal and a control signal provided from the host.

15 Claims, 2 Drawing Sheets

DUAL CHIP PACKAGE

BACKGROUND OF THE INVENTION

1. Field of the Invention

The present invention relates to semiconductor memory devices. More particularly, the invention relates to a dual chip package comprising two memory chips configured in a single package.

This application claims priority under 35 U.S.C § 119 to Korean Patent Application 2006-35480 filed on Apr. 19, 2006, the subject matter of which is hereby incorporated by reference.

2. Discussion of Related Art

Semiconductor memory devices may be categorized as random access memory (RAM) and read only memory (ROM). RAM is volatile in its storage nature and loses data when power is interrupted. In contrast, ROM is non-volatile and retains stored data even when power is interrupted. RAM includes dynamic RAM (DRAM) and static RAMs (SRAM). ROM includes programmable ROM (PROM), erasable PROM (EPROM), electrically EPROM (EEPROM), and flash memory.

Contemporary semiconductor memory devices are characterized by higher performance, lower cost, smaller size and greater integration density. Most semiconductor memory devices are now manufactured using technology allowing unit components having sizes in the range of 0.18 micrometer or less. Still higher integration densities and smaller component and circuit pattern sizes are highly desirable objectives in emerging semiconductor device designs. A variety of technical approaches have been advocated to reduce device size as well as the overall manufacturing costs.

One approach suggests manufacturing at least two individual semiconductor "chips" within a single package. For example, multi-chip packages may include a processor and associated memory chips, or one or more logic chips together with memory chips, or multiple memory chips. By reducing the number of separately packaged chips and eliminating the corresponding external (i.e., outside a chip package) means of connecting multiple chips, significant size and cost reductions may be realized.

One conventional approach to the manufacture of dual memory chips within a single package is disclosed, for example, in U.S. Pat. No. 6,366,487, the subject matter of which is hereby incorporated by reference. In the above-mentioned patent, a dual chip package technology is described. Consistent with this approach, identical memory chips are provided within a single package in order to increase memory capacity. The dual memory chips in the single package are configured to share external pins (e.g., address, control, and data pins). For this reason, the memory chips in the single package are classified, using option pads, into a designated "top" memory chip and a "bottom" memory chip.

For example, an option pad associated with a bottom memory chip may be connected to a ground voltage, while an option pad associated with the top memory chip may be connected to a power supply voltage. When an externally applied input address signal indicates the bottom memory chip (e.g., a most significant address bit in the input address matches a logic value apparent at an option pad associated with the bottom memory chip), the bottom memory chip is accessed using the input address. However, when an externally applied input address indicates the top memory chip (e.g., a most significant address bit in the input address matches a logic value apparent at an option pad associated with the top memory chip), the top memory chip is accessed using the input address.

In a typical conventional dual chip package, access to the bottom memory chip is disabled (i.e., cut off) during access period to the top memory chip, and vice verse. Thus, in conventional dual chip packages, the top and bottom memory chips cannot be simultaneously accessed. Thus, in the context of a dual chip package containing dual memory chips, the operating performance of the package (e.g., data bandwidth capabilities) is limited to the capabilities of one of the constituent chips.

SUMMARY OF THE INVENTION

In one embodiment, the invention provides a dual chip package connected to a host and comprising first and second memory chips. Each one of the first and second memory chips comprises; a flash memory, an option pad connected to either a first or second voltage indicative of a logical value, a register configured to store a flag signal indicating whether the first or second memory chip is selected, a comparator circuit configured to compare the flag signal with a logic value apparent at the option pad and generate a flash access signal, a memory controller unit configured to access the flash memory in at least one of the first and second memory chips in response to the flash access signal, and an interrupt controller unit configured to provide an interrupt signal to the host in response to the flash access signal and a control signal provided from the host.

BRIEF DESCRIPTION OF THE DRAWINGS

FIG. (FIG.) 1 is a block diagram of a dual chip package according to an embodiment of the present invention.

DESCRIPTION OF EMBODIMENTS

Embodiments of the invention will now be described in some additional detail with reference to the accompanying drawings. However, the invention may be embodied in many different forms and should not be construed as being limited to only the embodiments set forth herein. Rather, these embodiments are presented as teaching examples.

Figure 1:
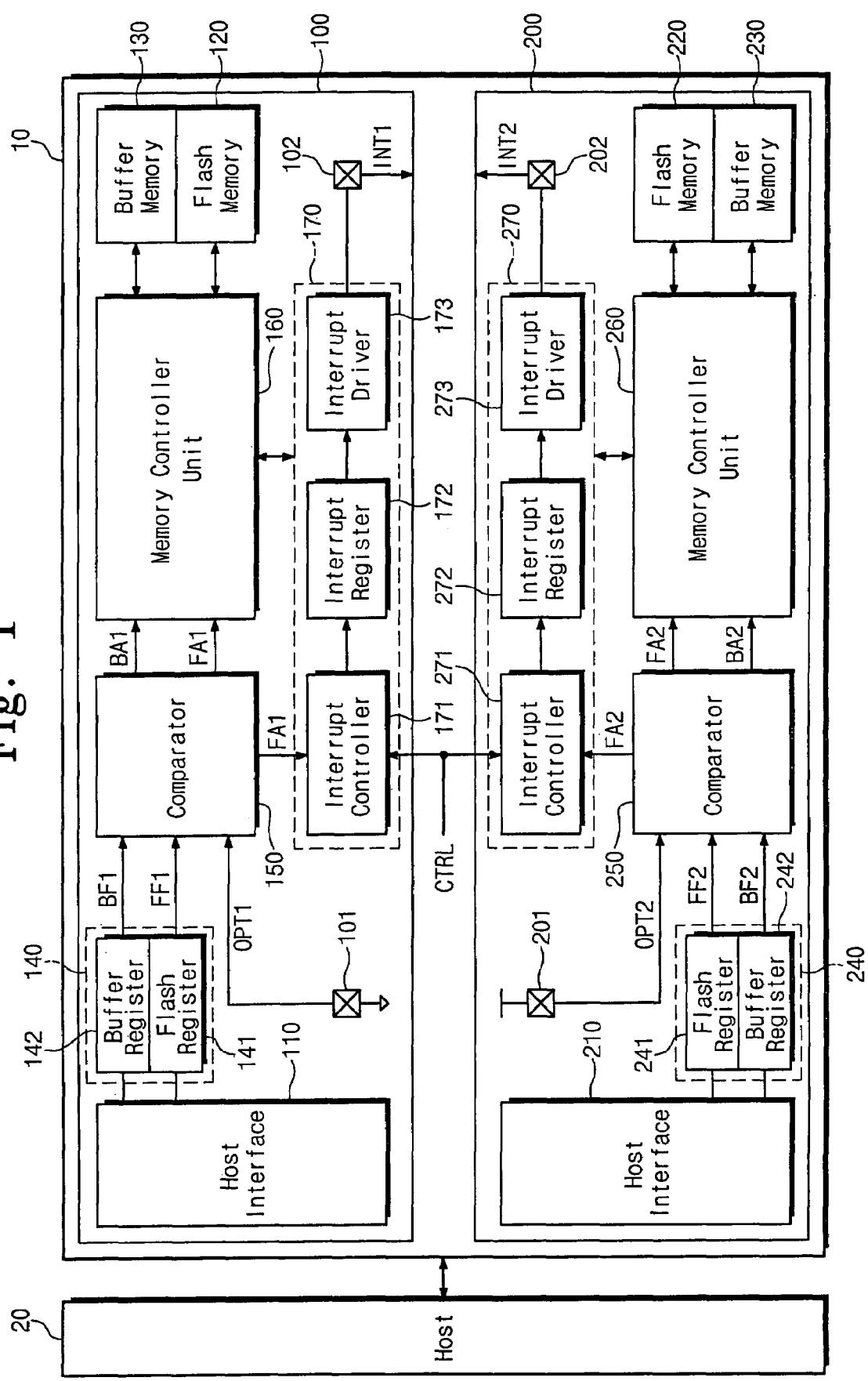

A dual chip package 10 according to one embodiment of the invention is illustrated in FIG. 1. The dual chip package 10 is configured to store data received from a host 20 and/or output data requested by the host 20. The dual chip package 10 includes a first memory chip 100 and a second memory chip 200. The first and second memory chips 100 and 200 include buffer memories 130 and 230, respectively. The dual chip package 10 is responsive to an interrupt signal INT enabling a flash memory 120 of the first memory chip 100 and a flash memory 220 of the second memory chip 200 to operate simultaneously.

In one embodiment, the first and second memory chips 100 and 200 are designed to have the same configuration. The dual chip package 10 includes control pins (not shown), address pins (not shown), and data pins (not shown), which are electrically connected to the host 20. Pins of the dual chip package 10 are shared by the first and second memory chips 100 and 200. That is, when a control signal, an address signal, and/or data signal are provided to the dual chip package 10 from the host 20, such signals may be simultaneously transmitted to the first and second memory chips 100 and 200.

Hereinafter, the first memory chip 100 will be referred to as a "bottom memory chip" or "LSB chip" and the second memory chip 200 will be referred to as a "top memory chip" or "MSB chip". These respective designations are entirely arbitrary, but are made consistent with existing convention.

Referring to FIG. 1, the bottom memory chip 100 includes a host interface 110, a flash memory 120, a buffer memory 130, a register 140, a comparator 150, a memory controller unit 160, and an interrupt controller unit 170. The bottom memory chip 100 further includes an option pad 101 and an interrupt pad 102.

The host interface 110 functions as an interface with the host 20 and may be constructed using various, conventionally understood means. For example, the host interface 110 may be implemented as an SRAM interface mechanism. Alternately, the host interface 110 may be implemented as a NOR flash memory interface mechanism, similar to the SRAM interface mechanism.

Now, an exemplary write operation of storing data in the flash memory 120 will be described in some additional detail. The host 20 transmits the "write data" to be stored in the dual chip package 10. Among the memory chips contained in the dual chip package 10, a selected memory chip (e.g., 100) temporarily stores the write data in the buffer memory 130. An exemplary operation of selecting between the bottom and top memory chips 100 and 200 will be described later. The write data stored in the buffer memory 130 is internally read under the control of the memory controller unit 160 and stored in the flash memory 120.

Now, an exemplary read operation communicating requested "read data" from the flash memory 120 to the host 120 will be described. Under the control of the memory controller unit 160, read data is read out from the flash memory 120. The read data is temporarily stored in the buffer memory 130. The read data is then internally read under the control of the memory controller unit 160 and communicated to the host 20.

The buffer memory 130 may be implemented, for example, as a conventional SRAM, DRAM, or similar RAM. The interface method implemented by the host interface 110 will be defined by this choice of memory device type implementing buffer memory 130.

The register 140 may be used to store addresses and commands received from the host 20 through the host interface 110. The addresses and the commands may include, for example, a buffer address for the buffer memory 130, a flash address for the flash memory 120, a read/program for the flash memory 120, etc. In one embodiment, the register 140 may be configured with a flash register 141 and a buffer register 142.

The flash register 141 may be used to store a flash flag signal FF1 indicating whether the bottom memory chip 100 is selected. For example, a logically low level flash flag signal FF1 (e.g., a flag bit) may be stored in the flash register 141 to select the bottom memory chip 100. In this case, when a read/program or similar command directed to the flash memory 120 is communicated from the host 20, the flash memory 120 of the bottom memory chip 100 is accessed. However, in a case where a high level flash flag signal FF1 is stored in the flash register 141, the flash memory 120 of the bottom memory chip 100 is not accessed even if a read/program or similar command directed to the flash memory 120 is received.

The buffer register 142 may be used to store a buffer flag signal BF1 (e.g., also a single flag bit) indicating whether the buffer memory 130 of the bottom memory chip 100 is selected. For example, a low level flag buffer signal BF1 may be stored in the buffer register 142 to access the buffer memory 130 of the bottom memory chip 100. In this case, when a read/program or similar command directed to the buffer memory 130 is received from the host 20, the buffer memory 130 of the bottom memory chip 100 is accessed. In a case where a high level buffer flag signal BF1 is stored in the buffer register 142, the buffer memory 130 is not accessed even if a read/program or similar command directed to the buffer memory 130 is received.

The comparator 150 compares each of the flag signals FF1 and BF1 stored in the register 140 with an option signal OPT1. For example, when the flash flag signal FF1 has the same value as the option signal OPT1, the comparator 150 enables a buffer access signal BA1. Further, when the buffer flag signal BF1 has the same value as the option signal OPT1, the comparator 150 enables the buffer access signal BA1. As illustrated in FIG. 1, the state of the option signal OPT1 may be determined by a terminal voltage connected to the option pad 101. For example, the option pad 101 of the bottom memory chip 100 may be connected to ground.

The memory controller unit 160 controls read/program and similar operations directed to the flash memory 120 in response to the flash access signal FA1 and controls read/program or similar operations directed to the buffer memory 130 in response to the buffer access signal BA1. For example, when the flash access signal FA1 is enabled, the memory controller unit 160 controls a write operation to transfer data from the buffer memory 130 in the flash memory 120, or a read operation to transfer data from the flash memory 120 to the buffer memory 130. In response to the buffer access signal BA1, the memory controller unit 160 also controls operations such that the buffer memory 130 may be accessed by the host 20.

The interrupt controller unit 170 provides an interrupt signal INT1 to the host 20 through an interrupt pad 102. The interrupt controller unit 170 includes an interrupt controller 171, an interrupt register 172, and an interrupt driver 173. The interrupt controller 171 receives a flash access signal FA1 and a control signal CTRL received from the host 20 and controls a value of the interrupt register 172. The interrupt controller 171 provides interrupt information to the memory controller unit 160. The interrupt driver 173 receives a value stored in the interrupt register 172 and outputs the interrupt signal INT1 through the interrupt pad 102. The operation of the interrupt controller unit 170 will be described in detail later.

The top memory chip 200 includes a host interface 210, a flash memory 220, a buffer memory 230, a register 240, a comparator 250, a memory controller unit 260, and an interrupt controller unit 270. The host interface 210, the buffer memory 230, the flash memory 220, and the memory controller unit 260 of the top memory chip 200 operate the same as the elements 110, 120, 130, and 160 of the bottom memory chip 100.

The flash register 241 is used to store a flash flag signal FF2 indicating whether the top memory chip 200 is selected. For example, a high level flash flag signal FF2 is stored in the flash register 142 to select the top memory chip 200. In this case, when a read/program or similar command directed to the flash memory 220 is received from the host 20, the flash memory 220 of the bottom memory chip 200 is accessed. In the case where a low level flash flag signal FF1 is stored in the flash register 241, the flash memory 220 of the bottom memory chip 200 is not accessed even if a read/program or similar command directed to the flash memory 220 is received from the host 20.

The buffer register 242 is used to store a buffer flag signal BF2 indicating whether the buffer memory 230 of the top memory chip 200 is selected. For example, a high level flag buffer signal BF2 may be stored in the buffer register 242 to access the buffer memory 230 of the top memory chip 200. In this case, when a read/program or similar command directed to the buffer memory 230 is received from the host 20, the buffer memory 230 of the top memory chip 200 is accessed. In the case where a low level buffer flag signal BF2 is stored in the buffer register 242, the buffer memory 230 is not accessed even if a read/program or similar command directed of buffer memory 230 is received from the host 20.

The comparator 250 compares each of the flag signals FF2 and BF2 stored in the register 240 with an option signal OPT2. For example, when the flash flag signal FF2 has the same value as the option signal OPT2, the comparator 250 enables a flash access signal FA2. Further, when the buffer flag signal BF2 has the same value as the option signal OPT2, the comparator 250 enables a buffer access signal BA2. As illustrated in FIG. 1, the option signal OPT2 is decided by a terminal voltage connected to an option pad 201. The option pad 201 of the top memory chip 100 is connected to a power supply voltage.

The interrupt controller unit 270 provides an interrupt signal INT2 to the host 20 through an interrupt pad 202. The interrupt controller unit 270 includes an interrupt controller 271, an interrupt register 272, and an interrupt driver 273. The interrupt controller 271 receives a flash access signal FA2 and a control signal CTRL provided from the host 20 and controls a value of the interrupt register 272. The interrupt controller 271 provides interrupt information to the memory controller unit 260. The interrupt driver 273 receives a value stored in the interrupt register 272 and outputs the interrupt signal INT2 through the interrupt pad 202. An operation of the interrupt controller unit 270 will be described in detail with reference to FIG. 2.

In the bottom and top memory chips 100 and 200, the flash flag signals FF1 and FF2 stored in the flash registers 141 and 241 are received from the host 20. The flash flag signals FF1 and FF2 are stored in the flash registers 141 and 241 before accessing the flash memories 130 and 230. For example, to store data in a given flash memory (e.g., 120) of the bottom and top memory chips 100 and 200, or to read data from the flash memory 120, values of the flash flag signals FF1 and FF2 are stored in the flash registers 141 and 241. Similarly, to access the buffer memories 130 and 230, values of buffer flag signals BF1 and BF2 are stored in the buffer registers 142 and 242.

Figure 2:
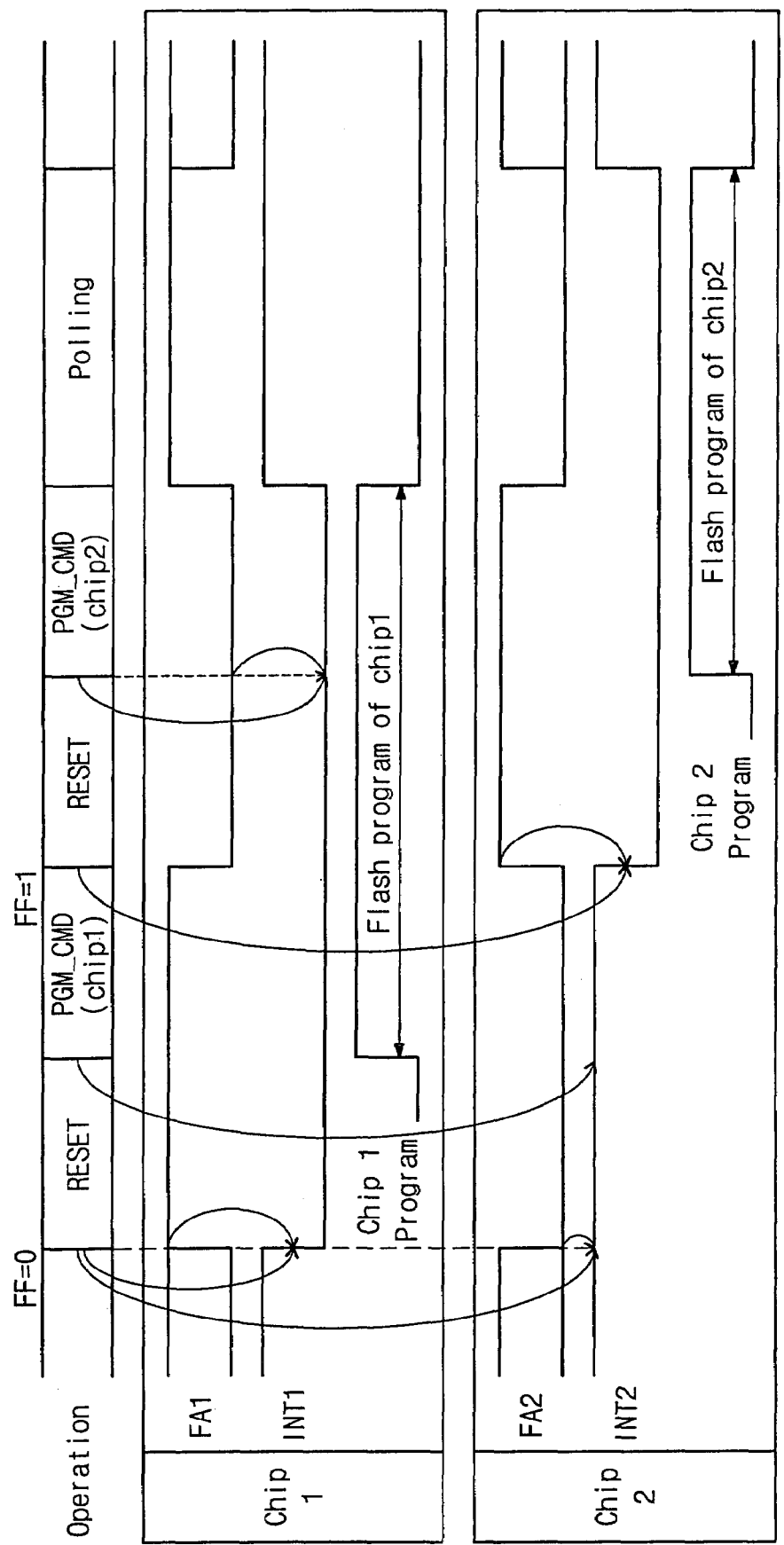
FIG. 2 is a related timing diagram illustrating operation of the dual chip package shown in FIG. 1.

FIG. 2 is a timing diagram illustrating an exemplary operation of the dual chip package 10 shown in FIG. 1. FIG. 2 shows that, for example, while the flash memory 120 of the bottom memory chip 100 performs a program operation, the flash memory 220 of the top memory chip 200 also performs a program operation. A program operation for the dual chip package 10 will be described below with reference to FIGS. 1 and 2.

Before the flash memories 130 and 230 are accessed, the flash flag signals FF1 and FF2 are stored in the flash registers 141 and 142. For example, a low level flash flag signal FF is stored in flash registers 141 and 241, as illustrated in FIG. 2. In response to the low level flash flag signal FF, a flash access signal FA1 of the bottom memory chip 100 goes to high while a flash access signal FA2 of the top memory chip 200 goes down to low.

A reset control signal RESET is provided to the dual chip package 10 from the host 20. The reset control signal RESET is simultaneously provided to the bottom memory chip 100 and the top memory chip 200, resetting the interrupt registers 172 and 272. The reset control signal RESET forces an interrupt signal INT1 to low such that the flash memory 120 of the selected bottom memory chip 100 performs a program operation.

It is noted that the reset control signal RESET is provided to not only the bottom memory chip 100 but also the top memory chip 200. Namely, an interrupt register 272 of an unselected top memory chip 200 may be reset. For this reason, the interrupt signal INT2 goes low although the flash memory 220 of the top memory chip 200 does not operate.

In order to overcome the above problem, a program control signal PGM_CMD is provided to the dual chip package 10 from the host 20. The program control signal PGM_CMD is a signal for programming the flash memory 120 of the bottom memory chip 100. However, the program control signal PGM_CMD is simultaneously provided to the bottom memory chip 100 and the top memory chip 200.

The memory controller unit 160 of the bottom memory chip 100 controls a program operation of the flash memory 120 in response to the program control signal PGM_CMD and a high level flash access signal FA1. Thus, the flash memory 120 of the bottom memory chip 100 performs a program operation. Meanwhile, the memory controller unit 260 of the top memory chip 200 does not conduct a program operation because a flash access signal FA2 is low. The interrupt signal INT2 of the top memory chip 200 is maintained at high.

If the program control signal PGM_CMD is provided to the dual chip package, the interrupt signal INT2 of an unselected top memory chip 200 goes up to a high level. However, in the dual chip packaged 10 according to the invention, the interrupt register 272 of the top memory chip 200 is not reset when the reset control signal RESET is input. Therefore, it is not necessary to forcibly shift a level of the interrupt signal INT2 to a high level when the program control signal PGM_CMD is input. According to the above-described dual chip package, there is no inconvenience that an interrupt signal of a memory chip is forcibly shifted to a high level when a program control signal is input after inputting a reset control signal.

While the flash memory 120 of the bottom memory chip 100 performs a program operation, a high level flash flag signal FF is stored in the flash registers 141 and 241 such that the flash memory 220 of the top memory chip 200 performs a program operation. In response to the high level flash flag signal FF, the flash access signal FA1 of the bottom memory chip 100 goes low while the flash access signal FA2 of the top memory chip 200 goes high.

The reset control signal RESET is again provided to the dual chip package 10 from the host 20. The reset control signal RESET is a signal for forcing the interrupt signal INT2 to go low such that the flash memory 220 of the top memory chip 200 performs a program operation. The interrupt controller 271 of the top memory chip 200 resets the interrupt register 272 in response to the high level flash access signal FA2. Meanwhile, the interrupt controller of the bottom memory chip 100 disables a reset operation of the interrupt register 172 in response to the low level flash access signal FA1. The bottom memory chip 100 maintains a low interrupt signal INT1.

The program control signal PGM_CMD is again provided to the dual chip package 10 from the host 20. The program control signal PGM_CMD is a signal for programming the flash memory 220 of the top memory chip 200. However, the program control signal PGM_CMD is simultaneously provided to the bottom memory chip 100 and the top memory chip 200. In response to the program control signal PGM_CMD and a high level flash access signal FA2, the memory controller unit 260 of the top memory chip 200 controls a program operation of the flash memory 200. Thus, the flash memory 220 of the top memory chip 200 performs a program operation.

In the dual chip package according to an embodiment of the invention, while the flash memory 120 of the bottom memory chip 100 continues to perform a program operation, the flash memory chip 220 of the top memory chip 200 may also perform a program operation. To achieve this, the interrupt signal INT1 of the bottom memory chip 100 should be maintained at a low level when the flash memory 200 of the top memory chip 200 performs a program operation.

However, in a conventional dual chip package, an interrupt signal INT1 of a bottom memory chip 100 goes high when a program control signal PGM_CMD is provided to a dual chip package 10. In the dual chip package 10 according to the invention, an interrupt signal INT1 is maintained low in response to the program control signal PGM_CMD and a low level flash access signal FA1. That is, the interrupt controller 171 of the bottom memory chip 100 enables the value of the interrupt register 172 to be maintained at low in response to the program control signal PGM_CMD and a low level flash access signal FA1.

Likewise, the dual chip package 10 according to an embodiment of the invention includes a memory chip having an interrupt controller unit 170 and a memory chip having an interrupt controller unit 270, controlling an interrupt signal INT. Thus, the dual chip package 10 is capable of accessing the flash memory 220 of the top memory chip 200 while accessing the flash memory 220 of the bottom memory chip 200. Since the bottom and top memory chips 100 and 200 are accessed simultaneously, operating characteristics such as read/write speed may be remarkably enhanced.

Although the present invention has been described in connection with the illustrated embodiments, it is not limited thereto. It will be apparent to those skilled in the art that various substitution, modifications and changes may be thereto without departing from the scope of the invention as defined by the following claims.

What is claimed is:

1. A dual chip package connected to a host and comprising: first and second memory chips, each comprising:
    a flash memory;
    an option pad connected to either a first or second voltage indicative of a logic level;
    a register configured to store a flag signal indicating whether the first or second memory chip is selected;
    a comparator circuit configured to compare the flag signal with a logic value apparent at the option pad and generate a flash access signal;
    a memory controller unit configured to access the flash memory in at least one of the first and second memory chips in response to the flash access signal; and
    an interrupt controller unit configured to provide an interrupt signal to the host in response to the flash access signal and a control signal provided from the host.

2. The dual chip package of claim 1, wherein the option pad of the first memory chip is connected to a ground voltage functioning as the first voltage, and the option pad of the second memory chip is connected to a power supply voltage functioning as the second voltage.

3. The dual chip package of claim 1, wherein the flag signal is stored in the registers of the first and second memory chips before an access operation directed to the flash memory of the respective first and second memory chips.

4. The dual chip package of claim 1, wherein the comparator circuit enables the flash access signal when the flag signal has the same logic level as the voltage apparent at the option pad.

5. The dual chip package of claim 4, wherein the memory controller unit accesses the flash memory in response to the enabled flash access signal.

6. The dual chip package of claim 5, wherein the interrupt controller unit provides a low level interrupt signal to the host in response to the enabled flash access signal.

7. The dual chip package of claim 1, wherein the comparator circuit disables the flash access signal when the flag signal has a different logic level from the voltage apparent at the option pad.

8. The dual chip package of claim 7, wherein the memory controller unit disables access to the flash memory in response to the disabled flash access signal.

9. The dual chip package of claim 8, wherein the interrupt controller unit maintains a previous interrupt signal in response to the disabled flash access signal.

10. The dual chip package of claim 1, wherein the interrupt controller unit comprises:
    an interrupt register configured to store the interrupt signal; and
    an interrupt controller configured to receive the flash access signal and the control signal and controlling a value of the interrupt register.

11. The dual chip package of claim 10, wherein the interrupt controller resets the interrupt register when a reset control signal is input while the flash access signal is enabled.

12. The dual chip package of claim 11, wherein the interrupt controller disables the reset operation of the interrupt register when the reset control signal is input while the flash access signal is disabled.

13. The dual chip package of claim 10, wherein the interrupt controller controls the interrupt register to maintain a previous interrupt signal when a program control signal is input while the flash access signal is disabled.

14. The dual chip package of claim 1, wherein each of the first and second memory chips further comprises:
    a buffer memory, and
    wherein the register stores a buffer flag signal indicating whether the buffer memory is selected among the flash memory and the buffer memory.

15. The dual chip package of claim 14, wherein the comparator circuit compares the buffer flag signal with a logic value apparent at the option pad to generate a buffer access signal, and
    wherein the memory controller unit accesses the buffer memory in response to the buffer access signal.

* * * * *